(12) United States Patent
Mellitz (10) Patent No.: US 9,846,189 B2
(45) Date of Patent: Dec. 19, 2017

(54) TECHNIQUES FOR CHARACTERIZING A TRANSMISSION LINE

(71) Applicant: INTEL CORPORATION, Santa Clara, CA (US)

(72) Inventor: Richard I. Mellitz, Prosperity, SC (US)

(73) Assignee: INTEL CORPORATION, Santa Clara, CA (US)

( * ) Notice: Subject to any disclaimer, the term of this patent is extended or adjusted under 35 U.S.C. 154(b) by 775 days.

(21) Appl. No.: 14/160,607

(22) Filed: Jan. 22, 2014

(65) Prior Publication Data

US 2015/0204927 A1    Jul. 23, 2015

(51) Int. Cl.
G01R 31/28    (2006.01)
G01R 15/00    (2006.01)
G01R 27/32    (2006.01)

(52) U.S. Cl.
CPC .................................... G01R 27/32 (2013.01)

(58) Field of Classification Search
CPC ...................................................... G01R 27/32
USPC ............... 324/615, 763.01; 702/57
See application file for complete search history.

(56) References Cited

U.S. PATENT DOCUMENTS 7,127,363 B2 * 10/2006 Loyer .................. G06F 17/5036
                                                    324/638

OTHER PUBLICATIONS

Lusted, K., "IEEE P802.3bj 100 Gb/s Backplane and Copper Cable Task Force", Plenary Meeting, Jan. 22-24, 2013, Phoenix, AZ., 13 pages.

"IEEE P802.3bm/D2.2, Draft Standard for Ethernet Amendment: Physical Layer Specifications and Management Parameters for 40Gb/s and 100 Gb/s Operation Over Fiber Optic Cables", Apr. 5, 2014, (Author Unknown), pp. 1-50.

"IEEE P802.3bm/D2.2, Draft Standard for Ethernet Amendment: Physical Layer Specifications and Management Parameters for 40Gb/s and 100 Gb/s Operation Over Fiber Optic Cables", Apr. 5, 2014, (Author Unknown), pp. 51-100.

"IEEE P802.3bm/D2.2, Draft Standard for Ethernet Amendment: Physical Layer Specifications and Management Parameters for 40Gb/s and 100 Gb/s Operation Over Fiber Optic Cables", Apr. 5, 2014, (Author Unknown), pp. 101-150.

"IEEE P802.3bm/D2.2, Draft Standard for Ethernet Amendment: Physical Layer Specifications and Management Parameters for 40Gb/s and 100 Gb/s Operation Over Fiber Optic Cables", Apr. 5, 2014, (Author Unknown), pp. 151-188.

* cited by examiner

Primary Examiner — Farhana Hoque (57) ABSTRACT

Examples are disclosed for characterizing a transmission line. Sets of scatter parameters (s-parameters) associated with measured or modeled insertion loss (IL) or return loss (RL) values over a range of frequencies may be acquired for a transmission line. One or more parameter values for use in IL or RL fit functions may be adjusted to reach a threshold for a coefficient of determination ($R^2$) value of a curve generated using the IL or RL fit functions to approximate the set of s-parameters over the range of frequencies. The IL or RL fit functions may then be used to generate other sets of s-parameters associated with IL or RL values for a recreated model of the transmission line. The other sets of s-parameters may be scaled to characterize transmission lines of various lengths. Other examples are described and claimed.

20 Claims, 6 Drawing Sheets

- ACQUIRE, AT CIRCUITRY FOR A COMPUTING DEVICE, A FIRST SET OF S-PARAMETERS ASSOCIATED WITH IL VALUES FOR A FIRST TRANSMISSION LINE OF A LENGTH OVER A FIRST RANGE OF TRANSMISSION FREQUENCIES
  502

- ADJUST IL FIT FUNCTION PARAMETER VALUES FOR AN IL FIT FUNCTION TO REACH A THRESHOLD FOR AN $R^2$ VALUE OF A CURVE GENERATED USING THE IL FIT FUNCTION THAT APPROXIMATES THE FIRST SET OF S-PARAMETERS OVER THE FIRST RANGE OF TRANSMISSION FREQUENCIES
  504

- ACQUIRE A SECOND SET OF S-PARAMETERS ASSOCIATED WITH RL VALUES FOR THE FIRST TRANSMISSION LINE OVER THE FIRST RANGE OF TRANSMISSION FREQUENCIES
  506

- ADJUST RL FIT FUNCTION PARAMETER VALUES FOR AN RL FIT FUNCTION TO REACH THE THRESHOLD FOR THE $R^2$ VALUE OF ANOTHER CURVE GENERATED USING THE RL FIT FUNCTION THAT APPROXIMATES THE SECOND SET OF S-PARAMETERS OVER THE FIRST RANGE OF TRANSMISSION FREQUENCIES
  508

TECHNIQUES FOR CHARACTERIZING A TRANSMISSION LINE

BACKGROUND

An electrical interconnect, channel or transmission line may be characterized for various electrical characteristics over a range of transmission frequencies or signaling rates. Characterization may include measuring or modeling electrical characteristics such as insertion or return loss for transmission lines having a differential connection. Some characterization techniques employ large matrixes of frequency domain data to model electrical characteristics. For example, a cable to be used as an electrical interconnect may require around 120,000 measured or modeled values for each differential connection. If the modeled cable includes a 4-pair model, over 1,000,000 values may be required. A high number of values may be needed because time domain conversion is how model data is typically used. Time domain conversion usually requires a very large bandwidth of finely sampled frequency domain points to characterize a transmission line.

DETAILED DESCRIPTION

As contemplated in the present disclosure, transmission line characterization techniques may require a large number of values to model electrical characteristics. In some examples, model data may employ a large matrix of scatter-parameter (s-parameter) transmission line data as a function of frequency. For example, a simple transmission line model may be a two-port network transmission line. Even a simple, two-port network transmission line may require hundreds of thousands of values to characterize or model over an expected operating range of transmission frequencies. As transmission frequencies continue to rise to levels approaching 40 gigahertz (GHz) and bandwidths of over 100 gigabits per second (Gb/s), the number of values needed to characterize or model even a simple, two-port network transmission line has also increased.

A large number of values for characterization may be problematic for manufactures of network devices, transmission cables, or other networking components attempting to certify that their devices, cables or components are compliant with one or more industry standards. For example, channel operation margin (COM) requirements as indicated in protocol standards such as those associated with the Institute of Electrical and Electronic Engineers (IEEE) 802.3-2012, Carrier sense Multiple access with Collision Detection (CSMA/CD) Access Method and Physical Layer Specifications, Published in December 2012 (hereinafter "IEEE 802.3") may require manufactures to provide excessively large data files including a large matrix of s-parameter transmission line data to demonstrate they have met COM requirements. It is with respect to these challenges that the examples described herein are needed.

In some examples, techniques for characterizing a transmission line may include acquiring, at circuitry for a computing device, a first set of s-parameters associated with modeled or measured insertion loss (IL) or return loss (RL) values for a first transmission line of a length over a first range of transmission frequencies. The example methods may also include adjusting IL and/or RL fit function parameter values for IL/RL fit functions to reach a threshold for respective coefficient of determination ($R^2$) values of IL/RL curves generated using the IL/RL fit functions to approximate respective first sets of IL/RL s-parameters over the first range of transmission frequencies. The IL/RL fit functions may be capable of being applied to a second range of transmission frequencies to generate a recreated set of s-parameters associated with IL and/or RL values for a recreated model of the transmission line of the length. The recreated set of s-parameters may be capable of being scaled based on an integer multiple of the length to derive a scaled, recreated set of s-parameters associated with IL and/or RL values for a second transmission line having a length substantially equal to the integer multiple of the length.

Figure 1:
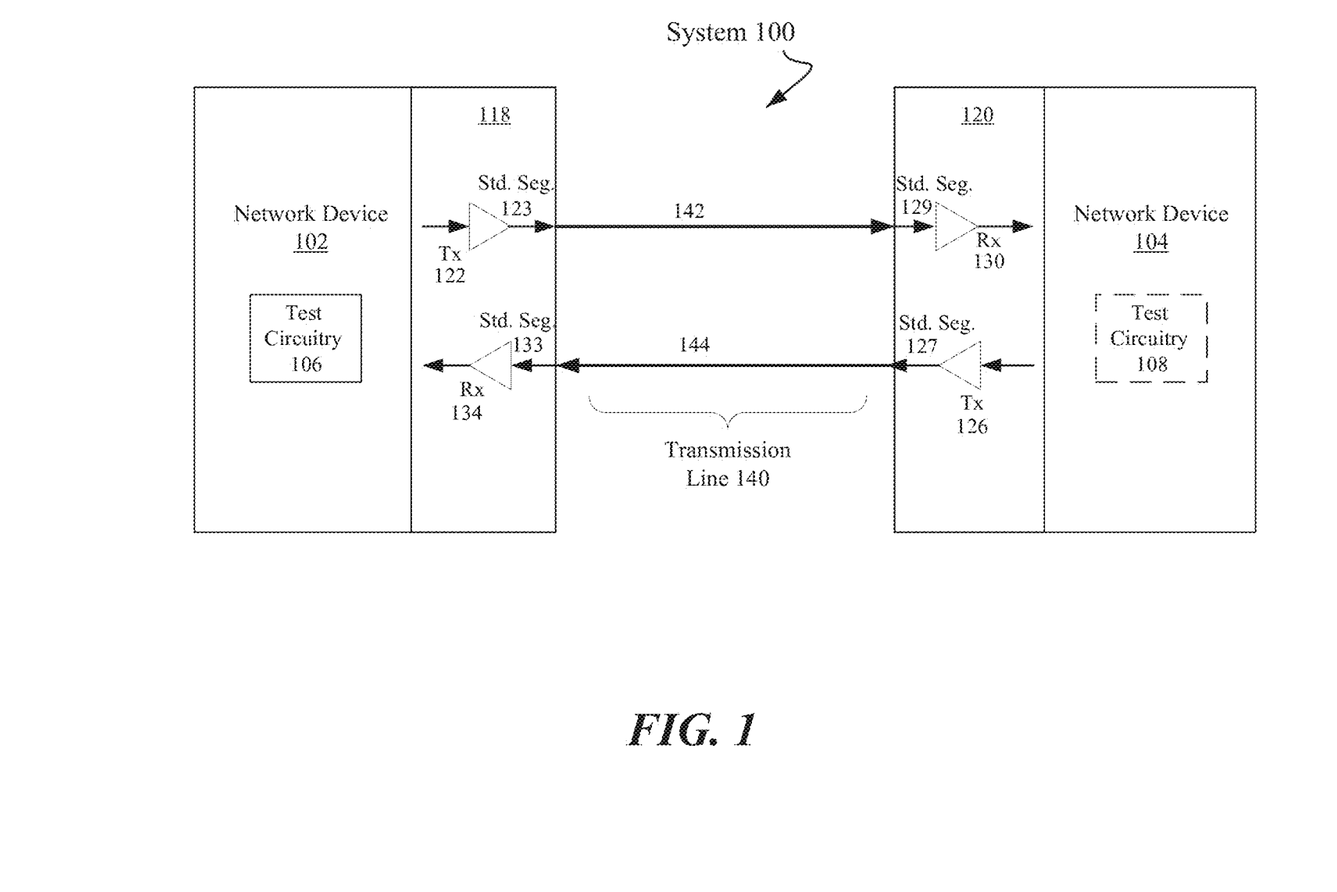
FIG. 1 illustrates an example system.

FIG. 1 illustrates an example system 100. As shown in FIG. 1, system 100 includes a first network device 102 and a second network device 104. In some examples, network device 102 and 104 may be capable of communicating with one another over a transmission line 140 having at least two channels 142 and 144 to enable a differential connection or coupling. A "channel" may be referred to as any combination of wires, copper traces, connectors, packages, interposers, wire bonds, vias, cables, etc. Channels 142 and 144 may include, for example, a media dependent interface such as copper twin-axial cable, backplane traces on a printed circuit board, etc.

In some examples, channels 142 and 144 of transmission line 140 may include a logical and/or physical channel (e.g., differential pair channel) that communicatively couples network devices 102 and 104. For these examples, system 100 may represent a network system and network device 102 and 104 may each represent a network controller (e.g., network interface card (NIC)), network interface circuitry, etc.), switch, router, network node element (e.g., server system, blade system, etc.) and/or other network device. It should be recognized, that the present disclosure has broad applicability to any system where communication between functional units can be advantageously enhanced by characterizing a transmission line such as transmission line 140. Characterizing, for example, may include converting a large matrix of s-parameter transmission line data to a relatively small set of fit function parameter values that may then be used to recreate a model of the transmission line.

According to some examples, network devices 102 or 104 may be configured to communicate in accordance with one or more Ethernet communication protocol standards to include but not limited to IEEE 802.3. For these examples, transmission line 140 may be arranged to meet COM requirements described in amendments or clauses to IEEE 802.3 that may include, but are not limited current or subsequent releases of amendments or clauses such as IEEE P802.3bj™, Draft Standard for Ethernet Amendment X: Physical Layer Specifications and Management Parameters for 100 Gb/S Operation Over Backplanes and Copper Cables or such as IEEE P802.3bm™, Draft Standard for Ethernet Amendment: Physical Layer Specifications and Management Parameters for 40 Gb/s and 100 Gb/S Operation Over Fiber Optic Cables.

In some examples, as shown in FIG. 1, network devices 102 and 104 may include respective physical interface (PHY) circuitry 118 and 120 that may be generally configured to interface network device 102 with 104, via transmission line 140. PHY circuitry 118/120 may include, for example, 10GBASE-KR, 40GBASE-KR4, 40GBASE-CR4, 100GBASE-CR10, 100GBASE-CR4, 100GBASE-KR4, and/or 100GBASE-KP4 and/or other PHY circuitry that may be compliant with IEEE 802.3, IEEE P802.3bj or IEEE P802.bm. PHY circuitry 118 and 120 may include respective transmit circuitry (Tx) 122 and 126 configured to transmit packets and/or frames. PHY circuitry 118 and 120 may include respective receive circuitry (Rx) 130 and 134 configured to receive packets and/or frames from corresponding Tx circuitry. In some examples, PHY Circuitry 118 and 120 may also include standard segments (std. seg.) 123 and 126 associated with respective Tx circuitry 122 and 126 and std. segs. 129 and 134 associated with respective Rx circuitry 130 and 134. These std. segs., for example, may be required as part of being compliant with IEEE 802.3, IEEE P802.3bj or IEEE P802.bm and may be other types of transmission lines that could be modeled or measured as described in this disclosure. PHY circuitry 118 and 120 may also separately include encoding/decoding circuitry (not shown) configured to perform analog-to-digital and digital-to-analog conversion encoding and decoding of data, analog parasitic cancellation or recovery of received data.

According to some examples, network device 102 includes test circuitry 106 that may be arranged to measure or test electrical characteristics such as insertion loss (IL) or return loss (RL) for transmission line 140 or other types of transmission lines such as std. segs. 123, 129, 127, or 133. In some examples, network device 104 may also include test circuitry 108 to also measure IL or RL for transmission line 140 or other types of transmission lines such as std. segs. 123, 129, 127, or 133. In other examples, rather than physically measure electrical characteristics, a model may be created to simulate the configuration of system 100 and thus model or simulate these electrical characteristics.

In some examples, as described in more detail below, logic and/or features of a computing device may be configured to acquire s-parameters associated with modeled or measured IL/RL values for a transmission line such as transmission line 140 or std. segs. 123, 129, 127, or 133. For these examples, the transmission line may have a length (e.g., 1 millimeter (mm)) and the s-parameters may be acquired over a range of transmission frequencies (e.g., 0.05 GHz to 40 GHz). Separate IL and RL fit functions may then be determined based on adjusting one or more fit function parameter values to reach an acceptable $R^2$ value (e.g., >0.98) for curves that approximate the acquired s-parameters over the range of transmission frequencies. Also as described more below, the separate IL and RL fit functions may be applied to a another range of transmission frequencies to generate other s-parameters associated with IL and RL values that may recreate the transmission line. As a result, a reconstruction of a possibly large and complex model may be possible using the separate IL and RL fit functions having a relatively small number of adjusted parameter values.

Figure 2:
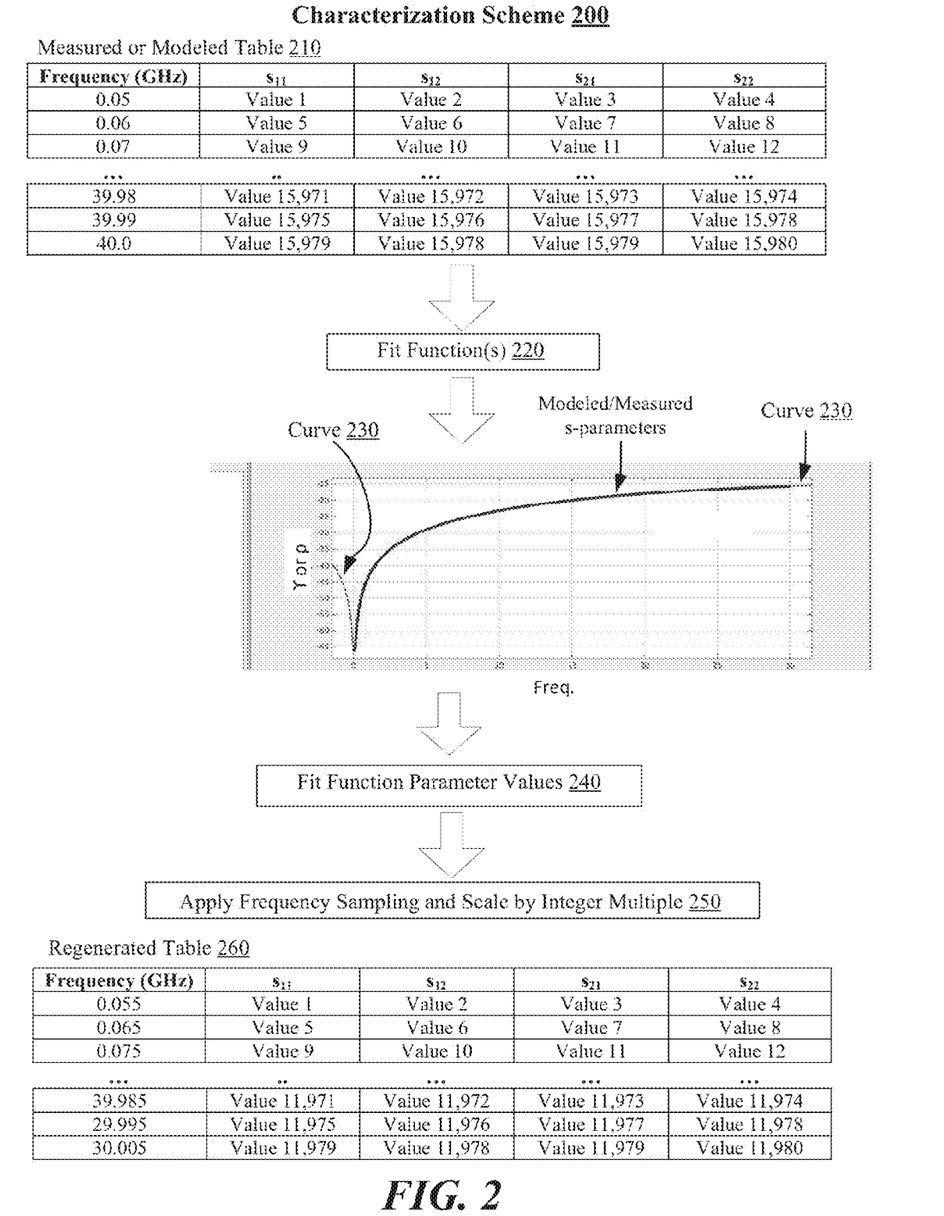
FIG. 2 illustrates an example characterization scheme.

FIG. 2 illustrates an example characterization scheme 200. According to some examples, a measured or modeled table 210 may be generated as part of characterization scheme 200. For these examples, as part of calculating COM for a transmission line having a length (e.g., 1 mm, 10 mm, 30 mm, etc.), various s-parameters may be determined. These s-parameters may be associated with measured or modeled IL and/or RL values for the transmission line. For measurement of the transmission line, the transmission line may include a victim signal path plus some number of far-end and near-end crosstalk paths. Each signal path may be represented by a set of frequency-dependent s-parameters and may correspond to differential-mode s-parameters. S-parameters measured at frequency f may be presented in a 2×2 matrix S(f) as shown in example equation (1).

$$S(f) = \begin{bmatrix} s_{11}(f) & s_{12}(f) \\ s_{21}(f) & s_{22}(f) \end{bmatrix} \quad \text{Example equation (1)}$$

In the case of multi-conductor networks or transmissions lines the s-parameter may be present in a n×m matrix S(f) as show in example equation (2)

$$S(f) = \begin{bmatrix} s_{11}(f) & \cdots & s_{1m}(f) \\ \vdots & \ddots & \vdots \\ s_{m1}(f) & \cdots & s_{nm}(f) \end{bmatrix} \quad \text{Example equation (2)}$$

For example equation (1), the relationship between S(f) and insertion loss (IL) may be that IL is the magnitude in decibel (dB) of either $1/s_{12}(f)$ or $1/s_{21}(f)$. An input and output return loss (RL) may be the magnitude in dB of $1/s_{11}(f)$ or $1/s_{22}(f)$, respectively.

For example equation (2), this example equation may be considered a general form of example equation (1) and the IL terms of the terms of S(f) may be where the indexes are not equal. In this manor, crosstalk terms may be considered as IL. The RL terms of the terms of S(f) may be where the indexes are equal.

For simplicity IL and RL may be considered collective terms. The examples in this disclosure that reference to IEEE 802.3bj may use or implement example equation (1). However, this disclosure may also apply to examples to may implement example equation (2).

According to some examples, s-parameters for a 1 mm transmission line may be modeled or measured over a first range of frequencies from 0.05 GHz to 40.0 GHz to generate values 1 to 15,980. This disclosure is not limited to a 1 mm transmission line or to a range of frequencies from 0.05 GHz to 40.0 GHz. As shown in FIG. 2 for measured or modeled table 210, a portion of these values are depicted that represent s-parameter values for $s_{11}$, $s_{12}$, $s_{21}$ or $s_{22}$ for each frequency in the first range. For measured or modeled table 210 values represented may be acquired for each 0.01 GHz frequency step over this first range of frequencies.

In some examples, one or more fit function(s) 220 may be determined based on adjusting one or more fit function parameter values to generate curve 230 to approximate the modeled/measured s-parameter values included in measured or modeled table 210 over the first range of frequencies. For these examples, fit function(s) 220 may include an RL fit function as shown in example equation (3) and an IL fit function as shown in example equation (4).

Example Equation (3) for RL Fit Function:

$$s_{11} = s_{22} = \exp(\rho_0 + \rho_1\sqrt{f} + \rho_2 f + \rho_4 f^2)$$

Example Equation (4) for IL Fit Function:

$$s_{12} = s_{21} = \exp(\gamma_0 + \gamma_1\sqrt{f} + \gamma_2 f + \gamma_4 f^2)$$

In some examples, an acceptable coefficient of determination ($R^2$) value may be predetermined to evaluate whether fit function(s) 220 implemented using example equations (3)

and (4) generate a curve with an acceptable fit to approximate the acquired s-parameter values included in measured or modeled table 210. For example, an acceptable $R^2$ value may be a value of greater than 0.98. In other examples, an even higher threshold value for $R^2$ (e.g., >0.99) may be needed to ensure that any time domain conversion of finely sampled frequencies can still acceptably recreate or approximate s-parameters over a similar but somewhat different range of frequencies.

According to some examples, fit function parameter values used for example equations (3) and (4) to generate an acceptable fit or $R^2$ value may include a list of complex numbers each having a real and imaginary part as shown in Table I below. These parameters may be included in fit function parameter values 240.

TABLE I

| Parameter | Real Value | Imaginary Value | Unit |
|---|---|---|---|
| $\rho_0$ | −6.47 | −1.51 | — |
| $\rho_1$ | 2.034 | 0.0106 | 1/GHz |
| $\rho_2$ | −0.2712 | −0.04903 | 1/GHz |
| $\rho_4$ | $2.167 \times 10^{-3}$ | $2.765 \times 10^{-4}$ | 1/GHz |
| $\gamma_0$ | $-4.453 \times 10^{-4}$ | $4.467 \times 10^{-5}$ | — |
| $\gamma_1$ | $-3.317 \times 10^{-4}$ | $-1.444 \times 10^{-3}$ | 1/GHz |
| $\gamma_2$ | $-6.409 \times 10^{-4}$ | −0.03914 | 1/GHz |
| $\gamma_4$ | $-1.669 \times 10^{-5}$ | $3.134 \times 10^{-5}$ | 1/GHz |

In some examples, s-parameters for another transmission line whose length $z_p$ is an integer multiple of 1 mm may enable s-parameters for this other transmission line to be scaled and regenerated using example equations (5) and (5).

Example Equation (5):

$$s_{11}{}^{(l)} = s_{22}{}^{(l)} = s_{11} \Sigma_{i=1}{}^{z_p} s_{21}{}^{2i-2}$$

Example Equation (6):

$$s_{12}{}^{(l)} = s_{21}{}^{(l)} = s_{21}{}^{z_p}$$

For these examples, apply frequency sampling and scale by integer multiple 250 may include the use of example equations (5) and (6) to generate regenerated table 260 as shown in FIG. 2. As shown in FIG. 2, the frequency range for regenerated table 260 goes from 0.055 GHz to 30.005 GHz rather than from 0.05 GHz to 40.0 GHz. Thus, using example equations (3) and (4), s-parameters may be regenerated for the other transmission line and then scaled based on the integer multiple used in example equations (5) and (6) to generate values 1 to 11,980 included in regenerated table 260. As a result, only the parameters in Table I rather than the 15,980 values in measured or modeled table 210 may be needed to regenerate s-parameters for the other transmission line when using example equations (3)-(6).

This disclosure is not limited to example equations (3)-(6) and/or the parameter values shown in Table I. Other fit functions having more or less parameters may be used to arrive at an acceptable $R^2$ value that demonstrates an acceptable fit between modeled or measured s-parameter values and enable a regeneration of s-parameters derived using these other fit functions that may be scaled to accommodate transmission lines of various lengths.

Figure 3:
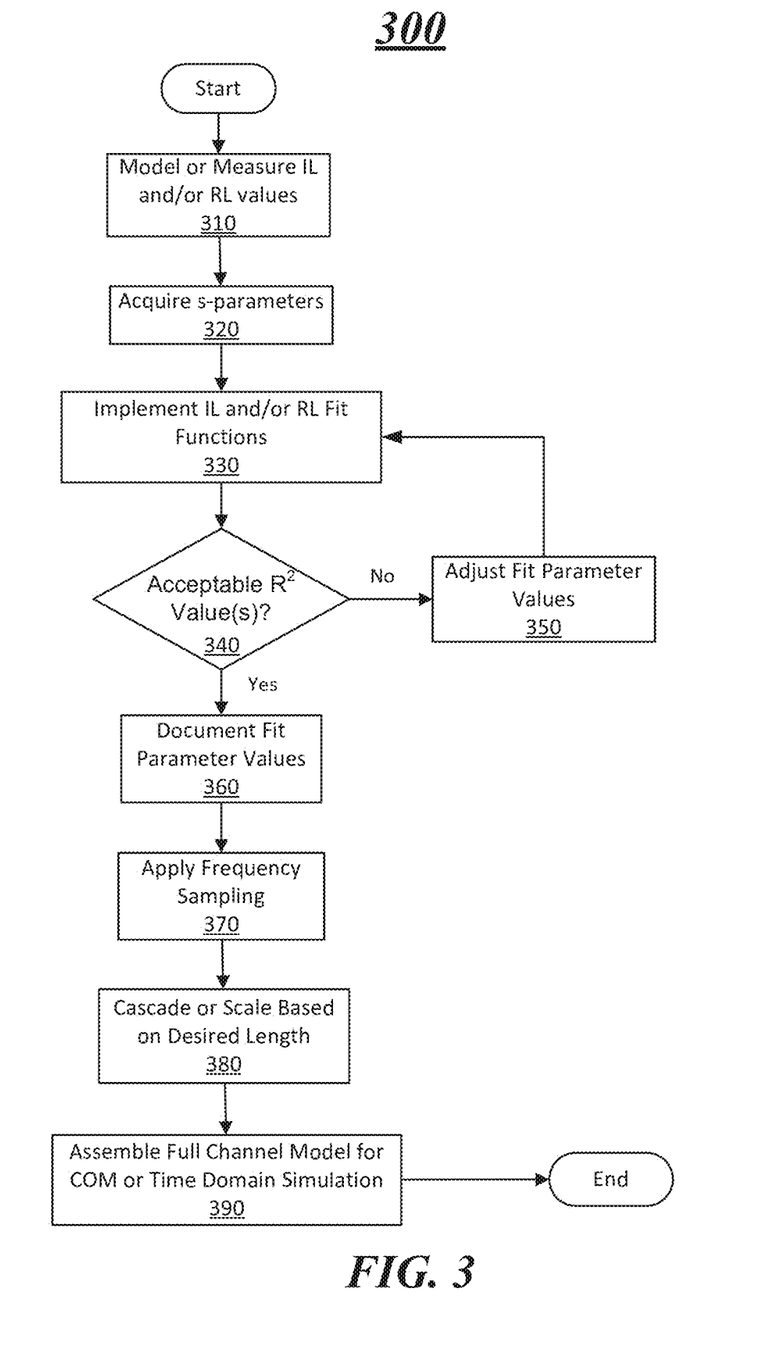
FIG. 3 illustrates a first flow.

FIG. 3 illustrates an example first flow. In some examples, as shown in FIG. 3, the first flow includes flow 300. Flow 300 may be implemented by logic and/or features of one or more computing devices that may acquire s-parameters associated with modeled or measured IL or RL values for a transmission line such as transmission line 140 or std. segs. 123, 129, 127, or 133 shown in FIG. 1 and described above. Also, the logic and/or features of the one or more computing devices may be capable of implementing at least portions of characterization scheme 200 as shown in FIG. 2 and described above. However, flow 300 is not limited to a transmission line configured liked transmission line 140 or std. segs. 123, 129, 127, or 133 or to characterization scheme 200, other transmission line configurations and/or characterization schemes are contemplated by this disclosure.

Moving from the start to block 310 (Model or Measure IL and/or RL Values), logic and/or features at a network device may model or measure IL and/or RL values over a range of transmission frequencies. For example, network device 102 may utilize test circuitry 106 to measure IL and/or RL values over the range of frequencies. In some examples, test circuitry 106 may also determine s-parameters associated with the measured IL and/or RL values for a transmission line such as transmission line 140 or std. segs. 123, 129, 127, or 133 that has a length of 1 mm. Also, for these examples, the transmission line may be configured or arranged as a two-port network transmission line. This disclosure is not limited to a transmission line configured as a two-port network transmission line, four-port, six-ports, eight-ports, etc. are also contemplated.

Proceeding from block 310 to block 320 (Acquire s-parameters), logic and/or features at a first computing device may acquire s-parameters associated with the modeled or measured IL/RL values from the network device. For example, the logic and/or features at the first computing device may be capable of acquiring the s-parameter associated with the measured IL/RL values for the transmission line that has a length of 1 mm and is configured as a two-port network transmission line. The s-parameters may be acquired from network device 102.

Proceeding from block 320 to block 330 (Implement IL and/or RL Fit Functions), the logic and/or features at the first computing device may implement IL/RL fit functions to generate respective IL/RL curves. In some examples, the IL fit function shown above for example equation (3) and the parameter values included in Table I may be used initially. Also, the RL fit function shown above for example equation (2) and the parameter values included in Table I may be used initially as well.

Proceeding from block 330 to decision block 340 (Acceptable $R^2$ Value(s)?), the logic and/or features at the first computing device may determine whether acceptable $R^2$ values have been reached for the respective IL/RL curves. In some examples, a threshold for the $R^2$ value may be pre-set such that an $R^2$ value of 0.98 or greater is needed in order to approximate the acquired s-parameters using the IL/RL curves. If an acceptable $R^2$ value has been reached for both IL/RL curves, the process moves to block 360. Otherwise the process moves to block 350.

Moving from decision block 340 to block 350 (Adjust Fit Parameter Values), the logic and/or features at the first computing device may adjust one or more fit parameter values for either one or both of the IL/RL curves that did not have an acceptable $R^2$. The corresponding IL/RL fit function may then be implemented again as described for block 330 with the exception that the one or more adjusted fit parameter values are used.

Moving from decision block 340 to block 360 (Document Fit Parameter Values), the logic and/or features at the first computing device may document the fit parameter values used in the IL/RL fit functions that met the threshold for the $R^2$ value. In some examples, the documented fit parameter values may then be accessible by others for possible use to recreate a model of the transmission line such as transmission line 140 or std. segs. 123, 129, 127, or 133 that has the length of 1 mm.

Proceeding from block 360 to block 370 (Apply Frequency Sampling), logic and/or features at a second computing device may obtain the documented fit parameter values and then apply frequency sampling. In some examples, applying frequency sampling may include implementing the IL/RL fit functions using the obtained fit parameter values. The implemented IL/RL fit functions may then generate a second set of s-parameters associated with IL/RL values for a recreated model of the 1 mm transmission line.

Proceeding from block 370 to block 380 (Cascade or Scale Based on Desired Length), logic and/or features at the second computing device may cascade or scale the second set of s-parameters based on a desired length of another transmission line. According to some examples, the other transmission line may have a length that is an integer multiple of 1 mm such as 8 mm. For these examples, the integer multiple would be 8. Example equation (4) may be used to scale the second set of s-parameters for RL values and example equation (5) may be used to scale the second set of s-parameters for IL values.

Proceeding from block 380 to block 390 (Assemble Full Channel Model for COM or Time Domain Simulation), logic and/or features at the second computing device may assemble a full channel model for COM or time domain simulation. In some examples, the full channel model for COM may enable a manufacture of the other transmission line to demonstrate compliance with a COM indicated in one or more communication protocols standards, amendments or clauses associated with IEEE 802.3 such as IEEE 802.3bj or IEEE 802.3bm. Also, a time domain simulation may be possible once the full channel model is assembled.

According to some examples, equations similar to example equations (2) to (5) and similar IL/RL parameter values may be documented and made available to others and may be included in the one or more communication protocols standards, amendments or clauses associated with IEEE 802.3 such as IEEE 802.3bj or IEEE 802.3bm. A non-volatile memory device (e.g., USB memory such as a thumb drive) may serve as a type of portable/removable storage device suitable to document or store IL/RL parameter values and enable transportation or access of those values to others. Also, the example equations (5) and (6) may be used to scale a given transmission line and the documented IL/RL parameter values may enable manufactures to model transmission lines having lengths substantially equal to integer multiples of 1 mm. Hence, a large matrix of s-parameter line data that is converted to a significantly smaller set of IL/RL parameter values may be used to demonstrate that COM requirements have been met and to assemble a time domain simulation.

Figure 4:
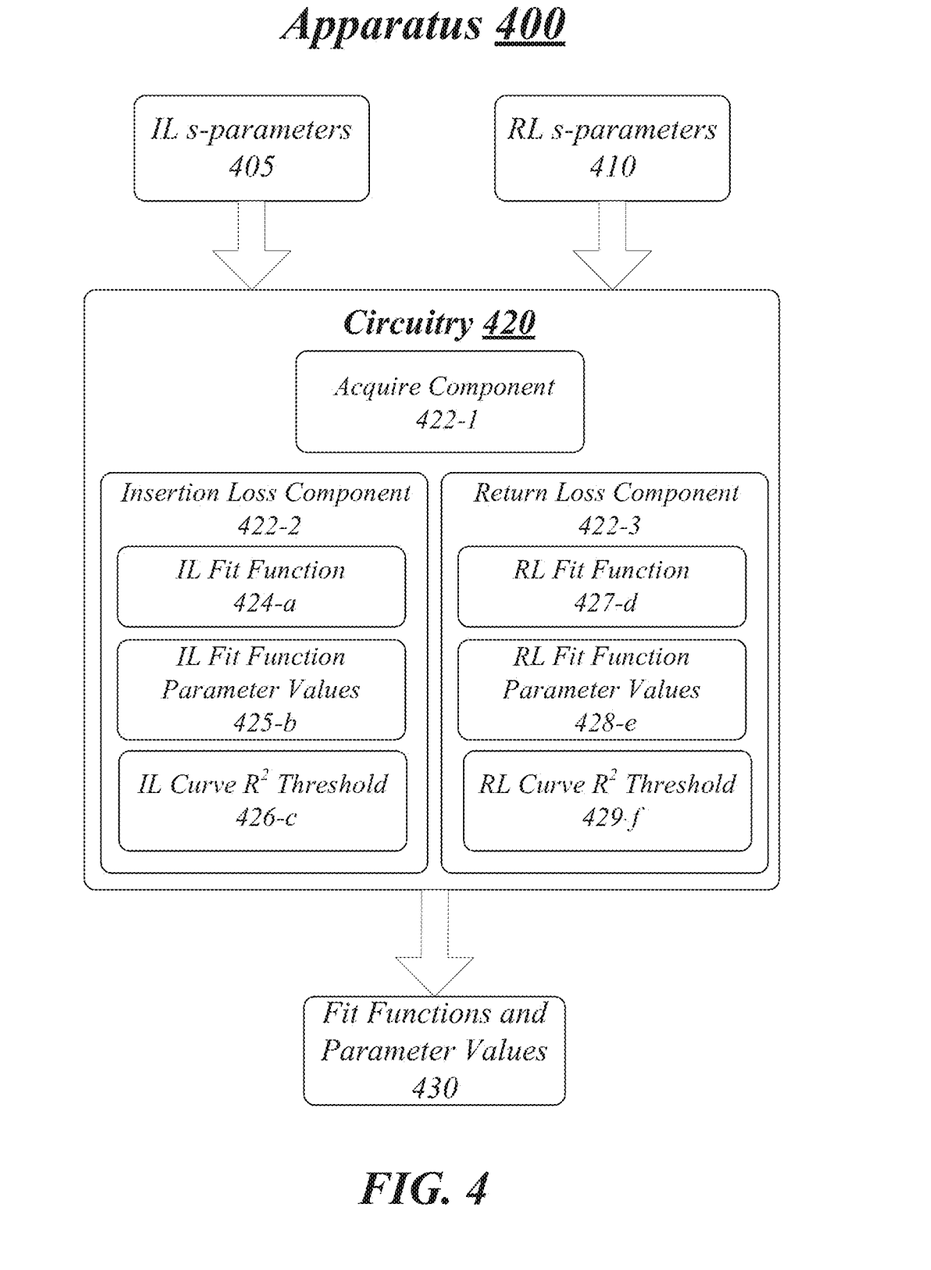
FIG. 4 illustrates an example block diagram for an apparatus.

FIG. 4 illustrates an example block diagram for a first apparatus 400. As shown in FIG. 4, the first apparatus includes an apparatus 400. Although apparatus 400 shown in FIG. 4 has a limited number of elements in a certain topology, it may be appreciated that the apparatus 400 may include more or less elements in alternate topologies as desired for a given implementation.

The apparatus 400 may be supported by circuitry 420 maintained at a computing device. Circuitry 420 may be arranged to execute one or more software or firmware implemented modules or components 422-$a$. It is worthy to note that "a" and "b" and "c" and similar designators as used herein are intended to be variables representing any positive integer. Thus, for example, if an implementation sets a value for a=3, then a complete set of software or firmware for components 422-$a$ may include components 422-1, 422-2 or 422-3. The examples presented are not limited in this context and the different variables used throughout may represent the same or different integer values.

According to some examples, circuitry 420 may include a processor or processor circuitry. Circuitry 420 may be part of a computing devise circuitry that includes processing cores (e.g., used as a central processing unit (CPU)). The circuitry including one or more processing cores can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel® Atom®, Celeron®, Core (2) Duo®, Core i3, Core i5, Core i7, Itanium®, Pentium®, Xeon®, Xeon Phi® and XScale® processors; and similar processors. According to some examples circuitry 420 may also be an application specific integrated circuit (ASIC) and at least some components 422-$a$ may be implemented as hardware elements of the ASIC.

According to some examples, apparatus 400 may include an acquire component 422-1. Acquire component 422-1 may be executed by circuitry 420 to acquire sets of scatter parameters associated with modeled or measured IL or RL values for a first transmission line of a length over a first range of transmission frequencies. In some examples, IL s-parameters 405 may include s-parameters associated with the modeled or measured IL values and RL s-parameters 410 may include s-parameters associated with the modeled or measured RL values.

According to some examples, apparatus 400 may also include an insertion loss component 422-2. Insertion loss component 422-2 may be executed by circuitry 420 to adjust IL fit function parameter values for an IL fit function to reach a threshold $R^2$ value of an IL curve generate by using the IL fit function parameters to approximate the s-parameters included in IL s-parameters 405 over the first range of transmission frequencies. For these examples, insertion loss component 422-2 may maintain the IL fit function and the IL fit function parameter values with IL fit function 424-$a$ and IL fit function parameter values 425-$b$. For example, in separate data structures such as separate lookup tables (LUTs). Insertion loss component 422-2 may also maintain the threshold $R^2$ value with IL curve $R^2$ threshold 426-$c$ (e.g., in another LUT). The threshold $R^2$ value for the IL curve, for example, may be ≥0.98.

In some examples, apparatus 400 may also include a return loss component 422-3. Return loss component 422-3 may be executed by circuitry 420 to adjust RL fit function parameter values for an RL fit to reach the threshold for the $R^2$ value of an RL curve generated using the RL fit function to approximate the s-parameters included in RL s-parameters 410 over the first range of transmission frequencies. For these examples, return loss component 422-2 may maintain the RL fit function and the RL fit function parameter values with RL fit function 427-$d$ and RL fit function parameter values 428-$e$ (e.g., in separate LUTs). Return loss component 422-3 may also maintain the threshold $R^2$ value with RL curve $R^2$ threshold 429-$f$ (e.g., in another LUT). The threshold $R^2$ value for the RL curve, for example, may be ≥0.98.

According to some examples, fit functions and parameter values 430 may include the IL or RL fit functions implemented by insertion loss component 422-2 or return loss component 422-3 using respective adjusted fit function parameter values to reach respective threshold $R^2$ values.

For these examples, fit functions and parameter values 430 may also include IL or RL fit function parameter values that resulted from those adjustments.

In some examples, the IL or RL fit functions and corresponding fit function parameter values included in fit functions and parameter values 430 may be capable of being applied to a second range of transmission frequencies (e.g., by an apparatus other than apparatus 400) to generate other sets of s-parameters associated with IL or RL values for a recreated model of the transmission line of the length. For these examples, the other sets of s-parameters may be capable of being scaled based on an integer multiple of the length to derive a third set of s-parameters that are associated with IL or RL values for a second transmission line having a length substantially equal to the integer multiple of the length.

Included herein is a set of logic flows representative of example methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, and/or hardware. In software and firmware embodiments, a logic flow may be implemented by computer executable instructions stored on at least one non-transitory computer readable medium or machine readable medium, such as an optical, magnetic or semiconductor storage. The embodiments are not limited in this context.

Figure 5:
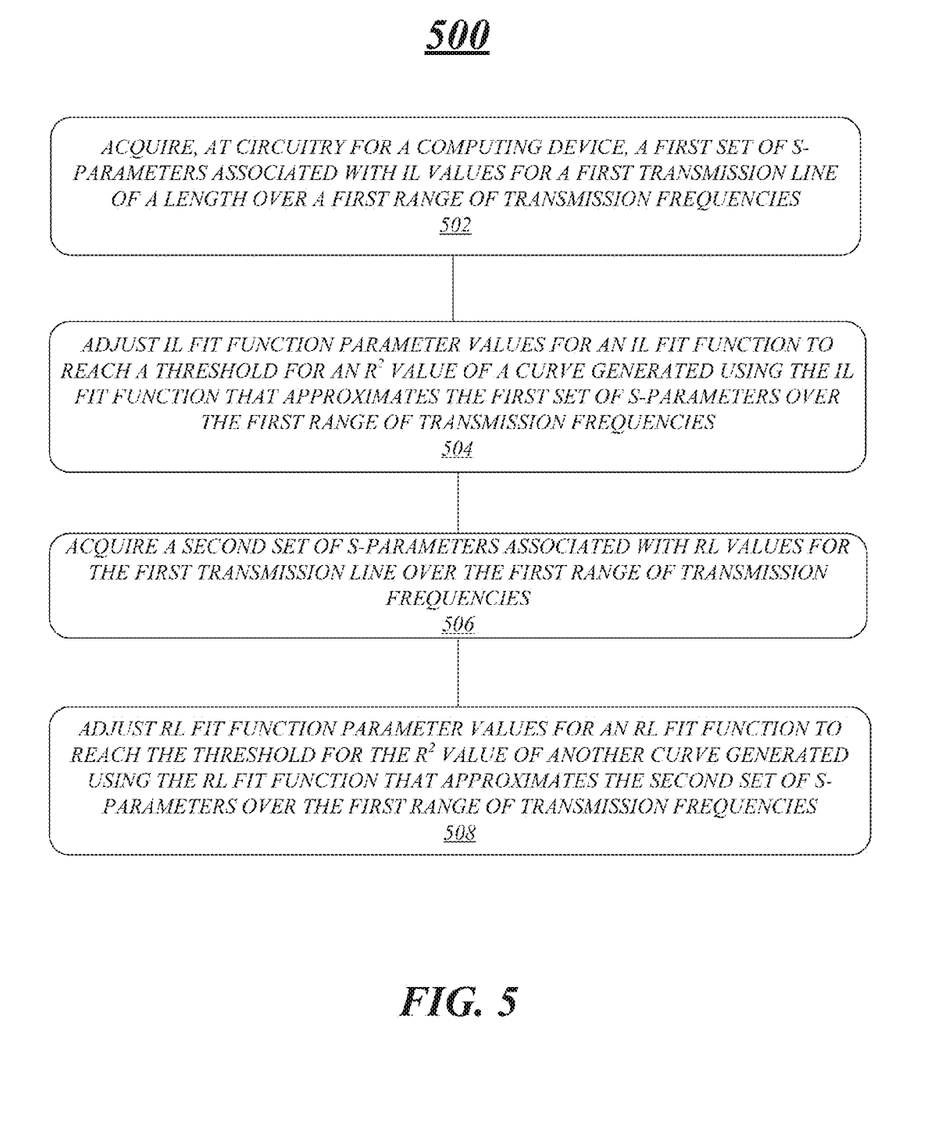
FIG. 5 illustrates an example of a second flow.

FIG. 5 illustrates an example of a second flow. As shown in FIG. 5 the second flow includes a logic flow 500. Logic flow 500 may be representative of some or all of the operations executed by one or more logic, features, or devices described herein, such as apparatus 400. More particularly, logic flow 500 may be implemented by at least acquire component 422-1, insertion loss component 422-2 or return loss component 422-3.

According to some examples, logic flow 500 at block 502 may acquire, at circuitry for a computing device, a first set of s-parameters associated with modeled or measured IL values for a first transmission line of a length over a first range of transmission frequencies. For these examples, acquire component 422-1 may acquire the first set of s-parameters.

In some examples, logic flow 500 at block 504 may adjust IL fit function parameter values for an IL fit function to reach a threshold $R^2$ value of a curve generated using the IL fit function that approximates the first set of s-parameters over the first range of transmission frequencies. For these examples, insertion loss component 422-2 may adjust the IL fit function parameter values for the IL fit function to reach the threshold $R^2$.

According to some examples, logic flow 500 at block 506 may acquire a second set of s-parameters associated with RL values for the first transmission line over the first range of transmission frequencies. For these examples, acquire component 422-1 may acquire the second set of s-parameters.

In some examples, logic flow 500 at block 508 may adjust RL fit function parameter values for an RL fit function to reach the threshold for the $R^2$ value of another curve generated using the RL fit function that approximates the fourth set of s-parameters over the first range of transmission frequencies. For these examples, return loss component 422-3 may adjust the RL fit function parameter values for the RL fit function to reach the threshold $R^2$.

Figure 6:
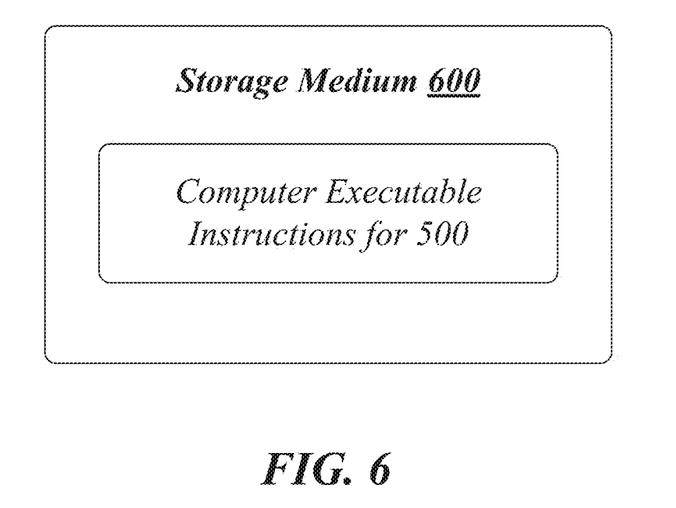
FIG. 6 illustrates an example of a storage medium.

FIG. 6 illustrates an example of a first storage medium. As shown in FIG. 6, the first storage medium includes a storage medium 600. The storage medium 600 may comprise an article of manufacture. In some examples, storage medium 600 may include any non-transitory computer readable medium or machine readable medium, such as an optical, magnetic or semiconductor storage. Storage medium 600 may store various types of computer executable instructions, such as instructions to implement logic flow 500. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 7:
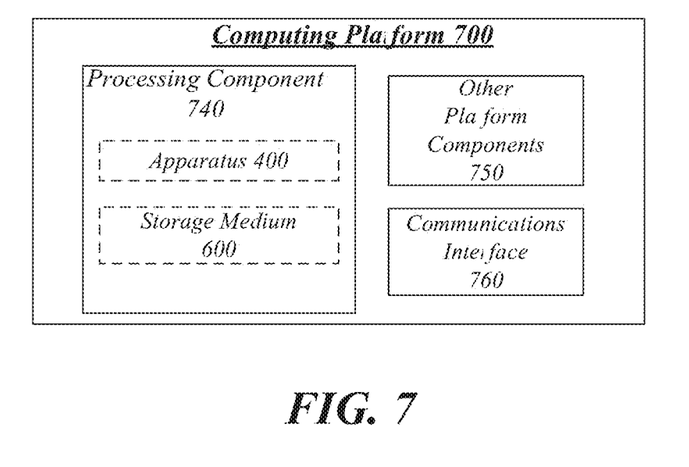
FIG. 7 illustrates an example computing platform.

FIG. 7 illustrates an example computing platform 700. In some examples, as shown in FIG. 7, computing platform 700 may include a processing component 740, other platform components or a communications interface 760. According to some examples, computing platform 700 may be implemented in a computing device such as a server in a system such as a data center or server farm.

According to some examples, processing component 740 may execute processing operations or logic for apparatus 400 and/or storage medium 600. Processing component 740 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, device drivers, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

In some examples, other platform components 750 may include common computing elements, such as one or more processors, multi-core processors, co-processors, memory units, chipsets, controllers, peripherals, interfaces, oscillators, timing devices, video cards, audio cards, multimedia input/output (I/O) components (e.g., digital displays), power supplies, and so forth. Examples of memory units may include without limitation various types of computer readable and machine readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, an array of devices such as Redundant Array of Independent Disks (RAID) drives, solid state memory devices (e.g., USB memory such as a thumb drive), solid state drives (SSD) and any other type of storage media suitable for storing information.

In some examples, communications interface 760 may include logic and/or features to support a communication interface. For these examples, communications interface 760 may include one or more communication interfaces that operate according to various communication protocols or standards to communicate over direct or network communication links. Direct communications may occur via use of communication protocols or standards described in one or more industry standards (including progenies and variants) such as those associated with the PCI Express specification. Network communications may occur via use of communication protocols or standards such those described in one or more Ethernet standards promulgated by the Institute of Electrical and Electronics Engineers (IEEE). For example, IEEE 802.3, IEEE P802.3bj or IEEE P802.3bm.

Computing platform 700 may be part of a computing device that may be, for example, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof. Accordingly, functions and/or specific configurations of computing platform 700 described herein, may be included or omitted in various embodiments of computing platform 700, as suitably desired.

The components and features of computing platform 700 may be implemented using any combination of discrete circuitry, application specific integrated circuits (ASICs), logic gates and/or single chip architectures. Further, the features of computing platform 700 may be implemented using microcontrollers, programmable logic arrays and/or microprocessors or any combination of the foregoing where suitably appropriate. It is noted that hardware, firmware and/or software elements may be collectively or individually referred to herein as "logic" or "circuit."

It should be appreciated that the exemplary computing platform 700 shown in the block diagram of FIG. 7 may represent one functionally descriptive example of many potential implementations. Accordingly, division, omission or inclusion of block functions depicted in the accompanying figures does not infer that the hardware components, circuits, software and/or elements for implementing these functions would necessarily be divided, omitted, or included in embodiments.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first, " "second," "third," and so forth, are used merely as labels, and are not intended to impose numerical requirements on their objects.

In some examples, an example apparatus may include circuitry for a computing device. For these examples, the apparatus may also include an acquire component for execution by the circuitry to acquire a first set of s-parameters associated with insertion loss values for a first transmission line of a length over a first range of transmission frequencies. The apparatus may also include an insertion loss component for execution by the circuitry to adjust insertion loss fit function parameter values for an insertion loss fit function to reach a threshold for an $R^2$ value of a curve generated using the insertion loss fit function that approximates the first set of s-parameters over the first range of transmission frequencies. The insertion loss fit function may be capable of being applied to a second range of transmission frequencies to generate a second set of s-parameters that are associated with insertion loss values for a recreated model of the transmission line of the length. The second set of s-parameters may be capable of being scaled based on an integer multiple of the length to derive a third set of s-parameters that are associated with insertion loss values for a second transmission line having a length substantially equal to the integer multiple of the length.

According to some examples, the apparatus may also include the acquire component to acquire a fourth set of s-parameters associated with return loss values for the first transmission line over the first range of transmission frequencies. For these examples, the apparatus may also include a return loss component for execution by the circuitry to adjust return loss fit function parameter values for an return loss fit function to reach the threshold for the $R^2$ value of another curve generated using the return loss fit function that approximates the fourth set of s-parameters over the first range of transmission frequencies. The return loss fit function may be capable of being applied to the second range of transmission frequencies to generate a fifth set of s-parameters that are associated with return loss values for the recreated model of the transmission line. The fifth set of s-parameters may be capable of being scaled based on the integer multiple of the length to derive a sixth set of s-parameters that are associated with both return loss and insertion loss values for the second transmission line.

In some examples for the apparatus, the threshold for the $R^2$ value may include a value greater than 0.98.

According to some examples for the apparatus, the length may be 1 millimeter.

In some examples for the apparatus, the first range of frequencies may begin at 0.05 GHz and end at 30 GHz. For these examples, the acquire component may acquire the insertion loss and return loss values for each 0.01 GHz frequency step beginning at 0.05 GHz and ending at 30 GHz.

According to some examples for the apparatus, the transmission line may include at least a two-port network transmission line in compliance with COM requirements indicated in one or more communication protocol standards, amendments or clauses associated with the IEEE 802.3-2012 standard including IEEE 802.3bj or IEEE 802.3bm.

In some examples, the apparatus may also include a digital display coupled to the circuitry to present a user interface view.

In some examples, an example method may include acquiring, at circuitry for a computing device, a first set of s-parameters associated with IL values for a first transmission line of a length over a first range of transmission frequencies. The method may also include adjusting IL fit function parameter values for an IL fit function to reach a threshold for an $R^2$ value of a curve generated using the IL fit function that approximates the first set of s-parameters over the first range of transmission frequencies. For these examples, the IL fit function may be capable of being applied to a second range of transmission frequencies to generate a second set of s-parameters that are associated with IL values for a recreated model of the transmission line of the length. The second set of s-parameters may be capable of being scaled based on an integer multiple of the length to derive a third set of s-parameters that are associated with IL values for a second transmission line having a length substantially equal to the integer multiple of the length.

According to some examples, the method may also include acquiring a fourth set of s-parameters associated with RL values for the first transmission line over the first range of transmission frequencies. For these examples, the method may also include adjusting RL fit function parameter values for an RL fit function to reach the threshold for the $R^2$ value of another curve generated using the RL fit function that approximates the fourth set of s-parameters over the first range of transmission frequencies. The RL fit function may be capable of being applied to the second range of transmission frequencies to generate a fifth set of s-parameters that are associated with RL values for the recreated model of the transmission line. The fifth set of s-parameters may be capable of being scaled based on the integer multiple of the length to derive a sixth set of s-parameters that are associated with both RL and IL values for the second transmission line.

In some examples for the method, the threshold for the $R^2$ value may include a value greater than 0.98.

According to some examples for the method, the length may be 1 millimeter.

In some examples for the method, the first range of frequencies may begin at 0.05 GHz and end at 30 GHz. For these examples, the IL and RL values may be acquired for each 0.01 GHz frequency step beginning at 0.05 GHz and ending at 30 GHz.

According to some examples for the method, the transmission line may include a two or more port network transmission line.

In some examples for the method, the two or more port network transmission line may be in compliance with COM requirements indicated in one or more communication protocol standards, amendments or clauses associated with the IEEE 802.3-2012 standard including IEEE 802.3bj or IEEE 802.3bm.

In some examples, an example at least one machine readable medium may include a plurality of instructions that in response to being executed on by circuitry may cause the circuitry to acquire a first set of s-parameters associated with IL values for a first transmission line of a length over a first range of transmission frequencies. For these examples, the instructions may also cause the circuitry to adjust IL fit function parameter values for an IL fit function to reach a threshold for an $R^2$ value of a curve generated using the IL fit function that approximates the first set of s-parameters over the first range of transmission frequencies. The IL fit function may be capable of being applied to a second range of transmission frequencies to generate a second set of s-parameters that are associated with IL values for a recreated model of the transmission line. The second set of s-parameters may be capable of being scaled based on an integer multiple of the length to derive a third set of s-parameters that are associated with IL values for a second transmission line having a length substantially equal to the integer multiple of the length According to some examples for the at least one machine readable medium, the instructions may also cause the circuitry to acquire a fourth set of s-parameters associated with RL values for the first transmission line over the first range of transmission frequencies. For these examples, the instructions may also cause the circuitry to adjust RL fit function parameter values for an RL fit function to reach the threshold for the $R^2$ value of another curve generated using the RL fit function that approximates the fourth set of s-parameters over the first range of transmission frequencies. The RL fit function may be capable of being applied to a second range of transmission frequencies to generate a fifth set of s-parameters that are associated with RL values for the recreated model of the transmission line. The fifth set of s-parameters may be capable of being scaled based on the integer multiple of the length to derive a sixth set of s-parameters that are associated with both RL and IL values for the second transmission line.

In some examples for the at least one machine readable medium, the threshold for the $R^2$ value may be a value greater than 0.98.

According to some examples for the at least one machine readable medium, the length may be 1 millimeter.

In some examples for the at least one machine readable medium, the first range of frequencies may begin at 0.05 GHz and end at 30 GHz. For these examples, the RL and IL values may be acquired for each 0.01 GHz frequency step beginning at 0.05 GHz and ending at 30 GHz.

According to some examples for the at least one machine readable medium, the transmission line may be at least a two-port network transmission line in compliance with COM requirements indicated in one or more communication protocol standards, amendments or clauses associated with the IEEE 802.3-2012 standard including IEEE 802.3bj or IEEE 802.3bm.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus comprising:
   circuitry for a computing device;
   an acquire component for execution by the circuitry, the acquire component to:
     acquire a first set of scatter parameters (s-parameters) associated with insertion loss values for a first transmission line over a first range of transmission frequencies, the first transmission line having a length;
   an insertion loss component for execution by the circuitry, the insertion loss component to:
     adjust insertion loss fit function parameter values for an insertion loss fit function to reach a threshold for a coefficient of determination ($R^2$) value of a curve generated using the insertion loss fit function, the curve to approximate the first set of s-parameters over the first range of transmission frequencies, the insertion loss fit function capable of being applied to a second range of transmission frequencies to generate a second set of s-parameters that are associated with insertion loss values for a recreated model of the transmission line of the length, the second set of s-parameters capable of being scaled based on an integer multiple of the length to derive a third set of s-parameters that are associated with insertion loss values for a second transmission line having a length substantially equal to the integer multiple of the length; and
   a modeling component for execution by the circuitry, the modeling component to assemble a full channel model for channel operating margin (COM) for the second transmission line.

2. The apparatus of claim 1, comprising:
   the acquire component to acquire a fourth set of s-parameters associated with return loss values for the first transmission line over the first range of transmission frequencies; and
   a return loss component for execution by the circuitry to adjust return loss fit function parameter values for an return loss fit function to reach the threshold for the $R^2$ value of another curve generated using the return loss fit function, the another curve to approximate the fourth set of s-parameters over the first range of transmission frequencies, the return loss fit function capable of being applied to the second range of transmission frequencies to generate a fifth set of s-parameters that are associated with return loss values for the recreated model of the transmission line, the fifth set of s-parameters capable of being scaled based on the integer multiple of the length to derive a sixth set of s-parameters that are associated with both return loss and insertion loss values for the second transmission line.

3. The apparatus of claim 2, comprising the threshold for the $R^2$ value comprising a value greater than 0.98.

4. The apparatus of claim 2, comprising the length comprising 1 millimeter.

5. The apparatus of claim 2, comprising the first range of frequencies beginning at 0.05 gigahertz (GHz) and ending at 30 GHz, the acquire component to acquire the insertion loss and return loss values for each 0.01 GHz frequency step beginning at 0.05 GHz and ending at 30 GHz.

6. The apparatus of claim 2, the transmission line comprising at least a two-port network transmission line in compliance with COM requirements indicated in one or more communication protocol standards, amendments or clauses associated with the Institute of Electrical and Electronic Engineers (IEEE) 802.3-2012 standard including IEEE 802.3bj or IEEE 802.3bm.

7. The apparatus of claim 1, comprising a removable storage device coupled to the circuitry, the removable storage device including a non-volatile memory arranged to store the adjusted insertion loss fit function parameter values.

8. A method comprising:
acquiring, at circuitry for a computing device, a first set of scatter parameters (s-parameters) associated with insertion loss (IL) values for a first transmission line of a length over a first range of transmission frequencies;
adjusting IL fit function parameter values for an IL fit function to reach a threshold for a coefficient of determination ($R^2$) value of a curve generated using the IL fit function, the curve to approximate the first set of s-parameters over the first range of transmission frequencies, the IL fit function capable of being applied to a second range of transmission frequencies to generate a second set of s-parameters that are associated with IL values for a recreated model of the transmission line of the length, the second set of s-parameters capable of being scaled based on an integer multiple of the length to derive a third set of s-parameters that are associated with IL values for a second transmission line having a length substantially equal to the integer multiple of the length; and
assembling a full channel model for channel operating margin (COM) for the second transmission line.

9. The method of claim 8, comprising:
acquiring a fourth set of s-parameters associated with return loss (RL) values for the first transmission line over the first range of transmission frequencies; and
adjusting RL fit function parameter values for an RL fit function to reach the threshold for the $R^2$ value of another curve generated using the RL fit function, the another curve to approximate the fourth set of s-parameters over the first range of transmission frequencies, the RL fit function capable of being applied to the second range of transmission frequencies to generate a fifth set of s-parameters that are associated with RL values for the recreated model of the transmission line, the fifth set of s-parameters capable of being scaled based on the integer multiple of the length to derive a sixth set of s-parameters that are associated with both RL and IL values for the second transmission line.

10. The method of claim 9, the threshold for the $R^2$ value comprising a value greater than 0.98.

11. The method of claim 9, the length comprising 1 millimeter.

12. The method of claim 9, comprising the first range of frequencies beginning at 0.05 gigahertz (GHz) and ending at 30 GHz, the IL and RL values acquired for each 0.01 GHz frequency step beginning at 0.05 GHz and ending at 30 GHz.

13. The method of claim 9, the transmission line comprising a two or more port network transmission line.

14. The method of claim 13, comprising the two or more port network transmission line in compliance with channel operating margin (COM) requirements indicated in one or more communication protocol standards, amendments or clauses associated with the Institute of Electrical and Electronic Engineers (IEEE) 802.3-2012 standard including IEEE 802.3bj or IEEE 802.3bm.

15. At least one non-transitory machine readable medium comprising a plurality of instructions that in response to being executed by circuitry causes the circuitry to:
acquire a first set of scatter parameters (s-parameters) associated with insertion loss (IL) values for a first transmission line of a length over a first range of transmission frequencies;
adjust IL fit function parameter values for an IL fit function to reach a threshold for a coefficient of determination ($R^2$) value of a curve generated using the IL fit function, the curve to approximate the first set of s-parameters over the first range of transmission frequencies, the IL fit function capable of being applied to a second range of transmission frequencies to generate a second set of s-parameters that are associated with IL values for a recreated model of the transmission line of the length, the second set of s-parameters capable of being scaled based on an integer multiple of the length to derive a third set of s-parameters that are associated with IL values for a second transmission line having a length substantially equal to the integer multiple of the length; and
assemble a full channel model for channel operating margin (COM) for the second transmission line.

16. The at least one non-transitory machine readable medium of claim 15, comprising the instruction to also cause the circuitry to:
acquire a fourth set of s-parameters associated with return loss (RL) values for the first transmission line over the first range of transmission frequencies; and
adjust RL fit function parameter values for an RL fit function to reach the threshold for the $R^2$ value of another curve generated using the RL fit function, the another curve to approximate the fourth set of s-parameters over the first range of transmission frequencies, the RL fit function capable of being applied to a second range of transmission frequencies to generate a fifth set of s-parameters that are associated with RL values for the recreated model of the transmission line, the fifth set of s-parameters capable of being scaled based on the integer multiple of the length to derive a sixth set of s-parameters that are associated with both RL and IL values for the second transmission line.

17. The at least one non-transitory machine readable medium of claim 16, the threshold for the $R^2$ value comprising a value greater than 0.98.

18. The at least one non-transitory machine readable medium of claim 16, the length comprising 1 millimeter.

19. The at least one non-transitory machine readable medium of claim 16, comprising the first range of frequencies beginning at 0.05 gigahertz (GHz) and ending at 30 GHz, the RL and IL values acquired for each 0.01 GHz frequency step beginning at 0.05 GHz and ending at 30 GHz.

20. The at least one non-transitory machine readable medium of claim 16, the transmission line comprising at least a two-port network transmission line in compliance with channel operating margin (COM) requirements indicated in one or more communication protocol standards, amendments or clauses associated with the Institute of Electrical and Electronic Engineers (IEEE) 802.3-2012 standard including IEEE 802.3bj or IEEE 802.3bm.

\* \* \* \* \*